(12) United States Patent
Nadaud et al.

(10) Patent No.: US 7,993,503 B2
(45) Date of Patent: Aug. 9, 2011

(54) METHOD FOR PREPARING BY THERMAL SPRAYING A SILICON-AND ZIRCONIUM-BASED TARGET

(75) Inventors: Nicolas Nadaud, Gentilly (FR); Dominique Billieres, Saint Saturnin les Avignon (FR)

(73) Assignee: Saint-Gobain Glass France, Courbevoie (FR)

(*) Notice: Subject to any disclaimer, the term of this patent is extended or adjusted under 35 U.S.C. 154(b) by 799 days.

(21) Appl. No.: 11/815,588

(22) PCT Filed: Feb. 3, 2006

(86) PCT No.: PCT/FR2006/050094
§ 371 (c)(1), (2), (4) Date: Feb. 14, 2008

(87) PCT Pub. No.: WO2006/085020
PCT Pub. Date: Aug. 17, 2006

(65) Prior Publication Data
US 2008/0138620 A1   Jun. 12, 2008

(30) Foreign Application Priority Data
Feb. 8, 2005  (FR) ...................................... 05 50358

(51) Int. Cl.
*C23C 14/06* (2006.01)
(52) U.S. Cl. .............................. 204/298.12; 204/298.13
(58) Field of Classification Search .............. 204/298.12, 204/298.13; 428/697, 698, 699; 427/446, 427/452, 455, 456, 299, 304, 305, 327, 328; 75/228, 244, 249
See application file for complete search history.

(56) References Cited

U.S. PATENT DOCUMENTS

| | | | | |
|---|---|---|---|---|
| 4,619,697 A * | 10/1986 | Hijikata et al. | ................. | 419/23 |
| 5,354,446 A | 10/1994 | Kida et al. | | |
| 5,377,045 A * | 12/1994 | Wolfe et al. | .................... | 427/166 |
| 5,409,517 A * | 4/1995 | Satou et al. | ...................... | 75/228 |
| 5,418,071 A * | 5/1995 | Satou et al. | .............. | 204/298.13 |
| 5,605,609 A * | 2/1997 | Ando et al. | .............. | 204/192.23 |
| 6,146,765 A * | 11/2000 | Mitsui et al. | ............. | 204/298.13 |
| 6,309,593 B1 * | 10/2001 | Sato et al. | ........................ | 419/45 |
| 6,432,545 B1 * | 8/2002 | Schicht et al. | ................. | 428/698 |
| 6,605,358 B1 * | 8/2003 | Stachowiak | ................... | 428/699 |
| 6,653,027 B2 * | 11/2003 | Angelopoulos et al. | ....... | 427/547 |
| 6,787,011 B2 * | 9/2004 | Ueda et al. | ............... | 204/298.12 |
| 7,090,921 B2 * | 8/2006 | Stachowiak | ................... | 428/699 |
| 7,153,578 B2 * | 12/2006 | Chonlamaitri et al. | ........ | 428/697 |
| 7,563,488 B2 * | 7/2009 | De Bosscher et al. | ... | 204/298.12 |
| 7,592,068 B2 * | 9/2009 | Disteldorf et al. | ............ | 428/698 |
| 2002/0119378 A1 | 8/2002 | Angelopoulos et al. | | |
| 2003/0103857 A1 | 6/2003 | Heindel et al. | | |
| 2005/0217988 A1 * | 10/2005 | Yoshikawa et al. | ....... | 204/298.12 |

FOREIGN PATENT DOCUMENTS

| | | |
|---|---|---|
| EP | 0 436 741 | 7/1991 |
| EP | 0 666 336 | 8/1995 |
| JP | 05-214525 | * 8/1993 |

OTHER PUBLICATIONS

P. Perez, et al., "Oxidation Behaviour of Al-Alloyed ZrSi2 at 700<0>C", Intermetallics, vol. 8, No. 12, XP 004223358, pp. 1393-1398, 2000.
D. Pilloud, et al., "Structural Changes in Zr-Si-N Films vs. Their Silicon Content", Surface and Coatings Technology, vol. 180-181, XP 002386022, pp. 352-356, 2004.
M. Nose, et al., "Microstructure and Mechanical Properties of Zr-Si-N Films Prepared by rf-Reactive Sputtering", Journal of Vacuum Science and Technology A., vol. 20, No. 3, XP 012006073, pp. 823-828, 2002.
M. Zhou, et al., "Influence of Sputtering Conditions on Microstructure and Mechanical Properties of Zr-Si-N Films Prepared by Radio-Frequency-Reactive Sputtering", Journal of Vacuum Science and Technology A., vol. 21, No. 5, XP 012006536, pp. 1791-1795, 2003.

* cited by examiner

*Primary Examiner* — Archene Turner
(74) *Attorney, Agent, or Firm* — Oblon, Spivak, McClelland, Maier & Neustadt, L.L.P.

(57) ABSTRACT

Method of producing a target by thermal spraying, especially by plasma spraying, said target comprising at least one compound based on atoms of different types chosen especially from the constituents M belonging to the (Zr, Mo, Ti, Nb, Ta, Hf, Cr) family and silicon, characterized in that at least one fraction of said compound, the constituents of which are bonded by covalent and/or ionic and/or metallic bonds, is injected into a plasma jet, said plasma jet spraying the constituents of said compound onto the target so as to deposit a coating of said compound on a surface portion of said target.

14 Claims, 2 Drawing Sheets

METHOD FOR PREPARING BY THERMAL SPRAYING A SILICON- AND ZIRCONIUM-BASED TARGET

The present invention relates to a method of producing a target by spraying or by an ion source, said target being intended to be used in vacuum deposition processes, in an inert or reactive atmosphere, especially by magnetically enhanced sputtering.

According to another aspect of the invention, it also relates to a target obtained by implementing said method, and to the use of such a target for the purpose of obtaining films based on the material sputtered from said target, and also a composition of the compound for producing said target by the method of the invention.

Various techniques resulting in targets being manufactured by forming a powder blend are known. Thus, the targets in question may result from a process in which said blend is cast or sintered, or, less conventionally, from a thermal spraying technique, and more particularly from a plasma spraying technique.

Thermal spraying techniques are satisfactory provided that they are used for producing targets made of a single constituent, but when the target is based on several constituents, the target generally exhibits structural heterogeneities that lead to inhomogeneities in the film deposited.

More particularly, the inventors have found that, in the case of powder blends in which the powders had substantially different densities, for example a blend based on powders comprising silicon (density =2.34), aluminum (density=2.7) and another constituent M whose density may be between 5 and 10, the differences in density between Si, Al on the one hand and M on the other result in the following problems:
- risk of segregation and therefore heterogeneity in the powder blend before injection, resulting in the end in a compositionally inhomogeneous target; and
- different trajectories of each of the species in the plasma stream for powders of different density, resulting in the separation of the beam of particles into as many beams as there are different levels of density (or as many beams as there are species or constituents in the blend). These separate beams then result in microstructural heterogeneities in the target, the microstructure then being of the multilayer type (superposition of layers A and B).

These heterogeneities in the target cause negative effects during the formation of thin films by sputtering (parasitic arcs, heterogeneity in the composition of the thin films). This may also increase the roughness of the surface of the target as a result of the variation in spray efficiency for the various regions within the target. This increase in roughness may result in extreme cases in the appearance of protuberances of significant size (a few mm in diameter/height) causing surface arcs to appear (enhancement of the electric field by the tip effect).

Furthermore, certain species that have to be blended with the constituents represent high industrial risks especially when they are present in the form of pure pulverulent metals (with a large specific surface area) within the particle size ranges required for plasma spraying (the risk of explosion in the case of certain pulverulent metals because of their extreme avidity for oxygen).

The object of the present invention is therefore to alleviate these drawbacks by proposing a method of producing targets by thermal spraying, especially by plasma spraying, which makes it possible to obtain a target with a homogeneous microstructure despite the disparity in respective densities of each of the species constituting the initial powder blend.

For this purpose, the method according to the invention for producing a target, by thermal spraying, especially by plasma spraying, said target comprising at least one compound based on atoms of different types chosen especially from the constituents M belonging to the (Zr, Mo, Ti, Nb, Ta, Hf, Cr) family and silicon, is characterized in that at least one fraction of said compound, the constituents of which are bonded by covalent and/or ionic and/or metallic bonds, is injected into a plasma jet, said plasma jet spraying the constituents of said compound onto the target so as to deposit a coating of said compound on a surface portion of said target.

By injecting a compound of the alloy type (or one having an intimate blend of atoms) into the plasma stream, there is no longer a risk of any heterogeneity between the constituent atoms of said compound in the material deposited.

In preferred ways of implementing the method of the invention, one or more of the following arrangements may optionally also be used:
- another fraction of said compound in the form of a powder blend is injected;
- the particle size of each of the powders forming the blend is adapted according to their respective density so that their respective mean masses are as close as possible;
- several injection channels are used, in which the injection parameters are independently adjusted according to the materials injected into each channel;
- the compound is sprayed in a chamber filled with an inert atmosphere after a prior vacuum purge;
- the compound is sprayed in a chamber that has been vacuum-purged and then filled with an inert gas, for pressure that may range from 50 mbar to 1000 mbar;
- a relative movement between the target and the plasma is performed;
- the target undergoes a surface treatment prior to the deposition of said compound;
- the surface treatment includes a cleaning operation carried out on the surface portion of the target;
- the surface treatment comprises the deposition of a layer of a tie material on the surface portion of the target;
- the surface portion of the target is thermally regulated during the plasma spraying;
- at least one silicide of said metal M is injected.

The subject of the invention is also a sputtering target, especially a magnetron sputtering target, said target comprising predominantly silicon, characterized in that its overall composition is of the $Si_xAl_yM$ type, where M is a metal chosen from Zr, Mo, Ti, Nb, Ta, Hf and Cr and in that it includes a compound at least of the $Si_xM_y$ type.

In preferred embodiments of the invention, one or more of the following arrangements may optionally also be employed:
- the target also includes a compound of the type consisting of a silicide of said metal;
- the target has a plane or tubular geometry;
- the target is based on a support material made of copper or a copper alloy;
- the target is coated with a tie layer based on a copper alloy;
- the target is based on a support material made of stainless steel; and
- the target is coated with a tie layer based on a nickel alloy.

Another subject of the invention according to yet another of its features is the composition of a compound comprising the constituents defined below and expressed in percentages by weight, for producing a target, characterized in that it comprises:
Al: 2 to 20%;
Si: 25 to 45%; and ZrSi$_2$: 45 to 70%.

Other features and advantages of the invention will become apparent over the course of the following description given by way of nonlimiting example and illustrated by the following figures.

Figure 1:
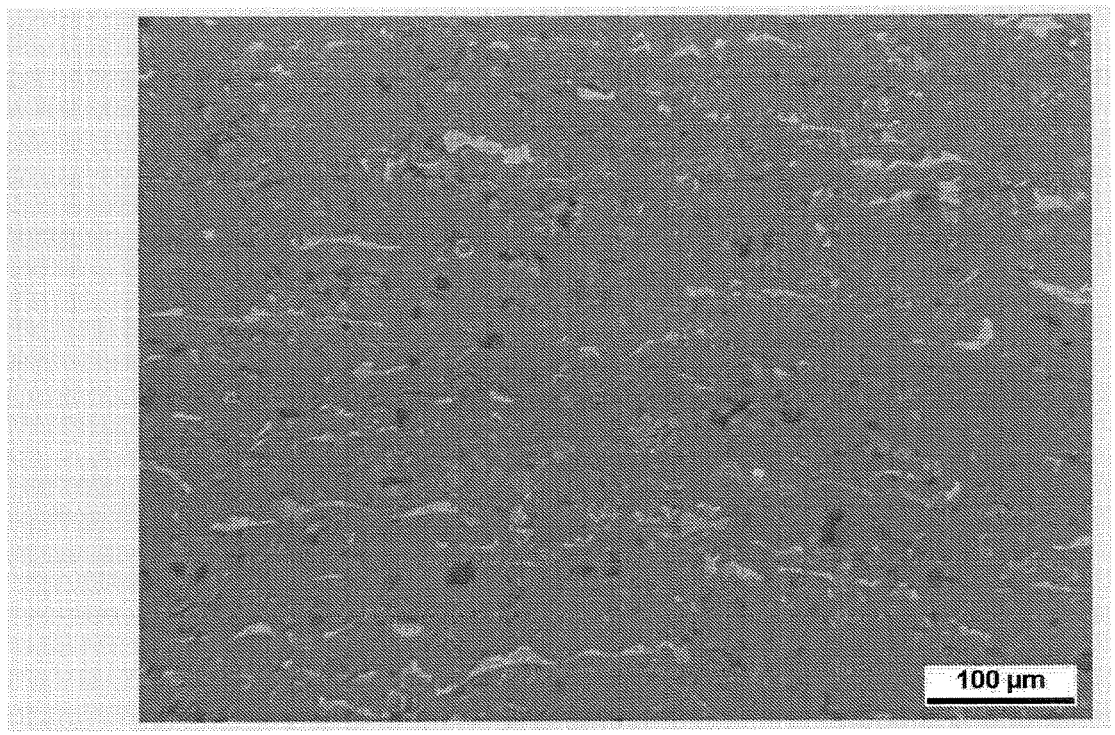
FIG. 1 is a sectional view showing the microstructure of an SiZrNAl target obtained by the production method according to the invention.

According to a preferred method of producing a target according to the invention, said target comprises a cylindrical or plane support made of a copper alloy or stainless steel. This metal support undergoes a surface treatment, which essentially consists of a cleaning operation by blasting its surface with abrasive particles (36 or 24 grit for example) or by machining lines or striations so as to promote the adhesion of a tie sublayer.

Different materials will be used for this tie sublayer depending on the nature of the material forming the target support. Thus, for a steel support, the sublayer is made of an Ni-based alloy (for example NiAl with 75 to 100% Ni by weight), whereas for a copper-based support plate, the sublayer is a copper-based alloy, for example of the Cu—Al—Fe or Cu—Al type (80 to 95% Cu, 5 to 20% Al and 0 to 5% Fe), the proportions being expressed by weight.

This sublayer may be deposited by a conventional plasma spraying technique. It is also possible to apply it by electric arc spraying or by oxyacetylene flame spraying. If required, several injection channels are used, in which the injection parameters are independently adjusted according to the materials injected into each channel. This also makes it possible to eliminate the negative effects of density disparities.

This support thus coated with a tie sublayer is installed in a chamber, a vacuum being initially drawn in the chamber before the latter is filled with an inert atmosphere (for example argon) at a pressure of 50 to 1000 mbar.

After a relative movement between the support intended to form the target and the plasma spraying device has been performed and after thermal regulation by circulation of a heat-transfer fluid within the metal support, a compound of SiZrAl composition is injected, said compound being obtained from a powder blend with the composition:

ZrSi$_2$: particle size=15-50 µm; density =4.88 g/cm$^3$;
Si: particle size=30-90 µm; density=2.34 g/cm$^3$; and
Al: particle size=45-75 µm; density =2.7 g/cm$^3$.

The three powders were blended in the required proportions, i.e.:

60 wt % ZrSi$_2$;
34.5 wt % Si; and
5.5 wt % Al.

In this example, the metal M chosen, which is linked to the silicon in the form of a silicide, is zirconium, but of course it would be possible to use a constituent in the form of a metal M chosen from Zr, Mo, Ti, Nb, Ta, Hf and Cr.

The functional Si-M-Al layer has a microstructure consisting of a juxtaposition of regions whose composition is predominantly Si, regions of composition M$_a$Si$_b$ and regions of composition Al, these being uniformly distributed, the size of these regions being from a few microns to about 100 microns.

This target is particularly intended to be used in a vacuum film deposition deposition installation (magnetron in an inert or reactive atmosphere, especially by magnetically enhanced sputtering, by corona discharge or by ion spraying), for the purpose of obtaining a film based on the material of which said target is formed, this film being based on a mixed silicon zirconium nitride, the refractive index of which is between 2.10 and 2.30, preferably between 2.15 and 2.25. This film is intended to be bonded (that is to say deposited directly on a substrate or indirectly on another film which is itself in contact with a substrate) to a substrate made of an organic material (PMMA or PC) or an inorganic material (silica-based glass).

Figure 2:
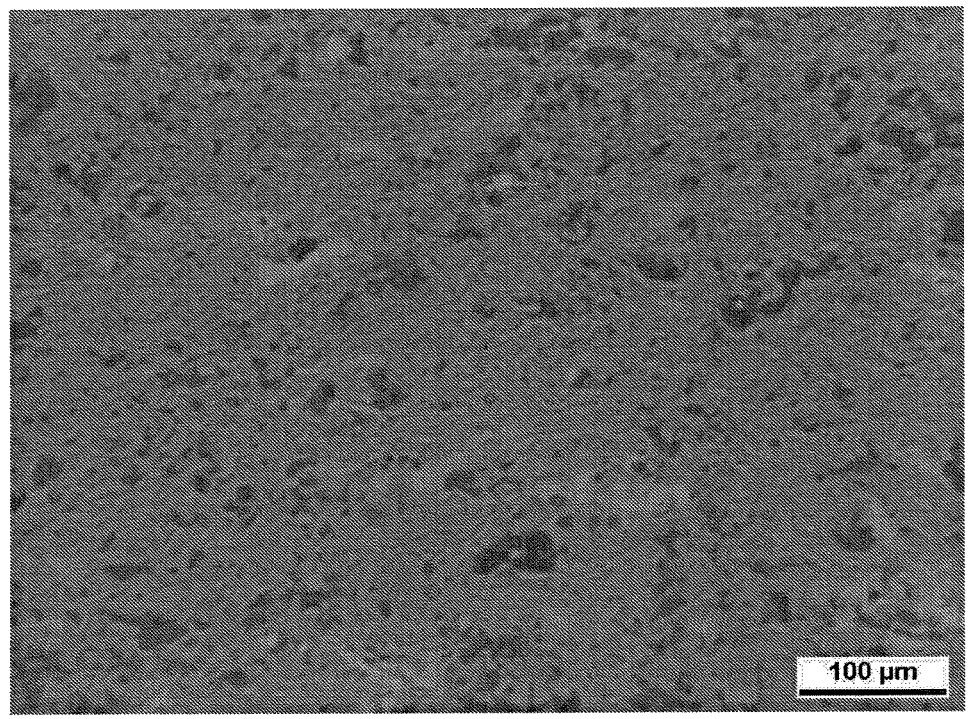
FIG. 2 is a sectional view showing the microstructure of a ZrSi$_2$Al target obtained by the production method according to the invention.

As may be seen in FIGS. 1 and 2, the structure is lamellar. Strata of white or light gray color correspond to aluminum, while the phase with a darker gray color corresponds to ZrSi$_2$ or ZrN. The black spots are the residual porosity.

Figure 3:
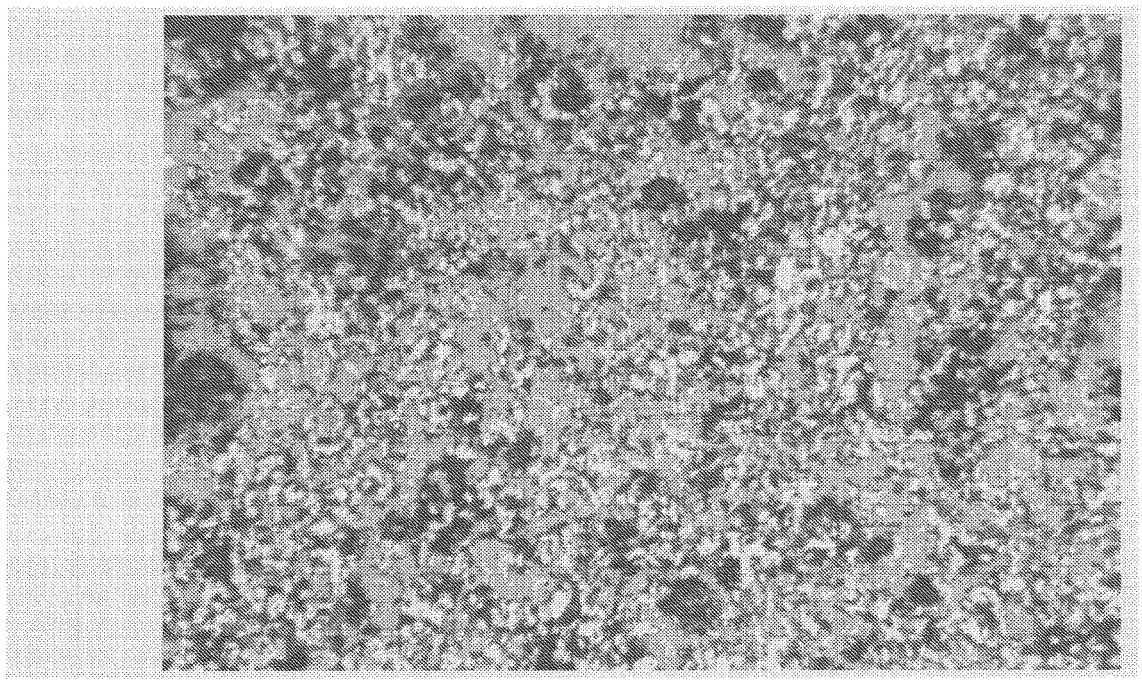
FIG. 3 is a sectional view showing the microstructure of a ZrSiAl target obtained by a conventional production method (by sintering).

The lamellar microstructure of these figures should be compared with that shown in FIG. 3. This FIG. 3 shows that the microstructure is not at all lamellar (there are no color or gray strata) and the gray phase is Si, while the black phase corresponds to the porosity and the white phases are Zr and Al. The materials appear in the form of particles uniformly distributed within the structure.

As a conclusion to this qualitative analysis, it is quite possible to characterize, on the basis of a microstructure, the method of producing the target thus analyzed.

The invention claimed is:

1. A composition of a compound, comprising:
Al: 2 to 20%;
Si: 25 to 45%; and
ZrSi$_2$: 45 to 70%,
expressed in percentages by weight, for producing a sputtering target, wherein the sputtering target comprises Si$_x$Al$_y$M, wherein M is a metal selected from the group consisting of Zr, Mo, Ti, Nb, Ta, Hf, and Cr, and obtained by a method comprising injecting at least one fraction of the compound, the constituents of which are bonded by covalent and/or ionic and/or metallic bonds, into a plasma jet, the plasma jet spraying the constituents of the compound onto an initial target and depositing a coating of the compound on a surface portion of the initial target, thereby forming the sputtering target.

2. The composition of claim 1, obtained from a powder blend, wherein respective particle sizes of the powder blend are:
ZrSi$_2$ particle size, between 15 and 50 µm;
Si particle size, between 30 and 90 µm; and
Al particle size, between 45 and 75 µm.

3. The composition of claim 1, wherein M is Zr.

4. The composition of claim 1, wherein the method further comprises, after the injecting, subsequently injecting another fraction of the compound in the form of a powder blend.

5. The composition of claim 4, wherein the powder blend comprises powders, and the particle size of each of the powders forming the blend is adapted according to their respective density so that their respective mean masses are as close as possible.

6. The composition of claim 1, wherein the compound is sprayed in a chamber filled with an inert atmosphere.

7. The composition of claim 6, wherein the compound is sprayed in a chamber that has been vacuum-purged and then filled with an inert gas, to a pressure ranging from 50 mbar to 1000 mbar.

8. The composition of claim 1, wherein a relative movement between the initial target and the plasma is performed.

9. The composition of claim 1, wherein the method further comprises treating a surface of the initial target prior to the deposition of said compound.

10. The composition of claim 9, wherein the treating the surface comprises a cleaning operation carried out on the surface portion of the initial target.

11. The composition of claim 9, wherein the treating the surface comprises deposition of a layer of a tie material on the surface portion of the initial target.

12. The composition of claim 1, wherein the surface portion of the initial target is thermally regulated during the spraying by the plasma jet of said compound.

13. The composition of claim 1, wherein at least one silicide of Zr, Mo, Ti, Nb, Ta, Hf, and/or Cr, is injected.

14. The composition of claim 1, wherein, during the injecting, several injection channels are employed, in which injection parameters are independently adjusted according to materials injected into each channel.

* * * * *

UNITED STATES PATENT AND TRADEMARK OFFICE
CERTIFICATE OF CORRECTION

| | | |
|---|---|---|
| PATENT NO. | : 7,993,503 B2 | Page 1 of 1 |
| APPLICATION NO. | : 11/815588 | |
| DATED | : August 9, 2011 | |
| INVENTOR(S) | : Nicolas Nadaud et al. | |

It is certified that error appears in the above-identified patent and that said Letters Patent is hereby corrected as shown below:

<u>In column 3, Line 66</u>
"film deposition deposition installation..." should read -- film deposition installation... --

Signed and Sealed this
Eighth Day of November, 2011

David J. Kappos
*Director of the United States Patent and Trademark Office*